United States Patent [19]

Elliott

[11] Patent Number: 4,754,545
[45] Date of Patent: Jul. 5, 1988

[54] COMPONENT HANDLING MACHINE

[75] Inventor: James Elliott, Mission Viejo, Calif.

[73] Assignee: Western Digital Corporation, Irvine, Calif.

[21] Appl. No.: 864,287

[22] Filed: May 16, 1986

[51] Int. Cl.$^4$ ............................................. H05K 3/30
[52] U.S. Cl. .................................... 29/740; 29/759; 198/456
[58] Field of Search ............... 29/740, 741, 759, 840, 29/DIG. 46; 192/2 B; 198/456, 768, 769

[56] References Cited

U.S. PATENT DOCUMENTS

| | | | |
|---|---|---|---|
| 2,765,900 | 10/1956 | Seabrooke | 193/2 B |
| 4,342,090 | 7/1982 | Caccoma et al. | 29/740 X |
| 4,459,743 | 7/1984 | Watanabe et al. | 29/740 |
| 4,528,746 | 7/1985 | Yoshimura | 29/743 |
| 4,646,432 | 3/1987 | Vancelette | 29/740 X |

FOREIGN PATENT DOCUMENTS 0772945 10/1980 U.S.S.R. ................ 198/769

Primary Examiner—Carl E. Hall
Attorney, Agent, or Firm—Spensley Horn Jubas & Lubitz

[57] ABSTRACT

A pick and place machine having an electronic component feed device is described. The feed device feeds electronic components to various pick up locations with such high positional accuracy that alignment jaws on the pick up head are not necessary. Elevated tracks run parallel to a printed circuit board conveyor belt. These elevated tracks support an arm which in turn supports the electronic component pick up head. The feed device is positioned under the elevated tracks so that an operator can replenish the supply of electronic components in the feed device without reaching over the tract.

9 Claims, 3 Drawing Sheets

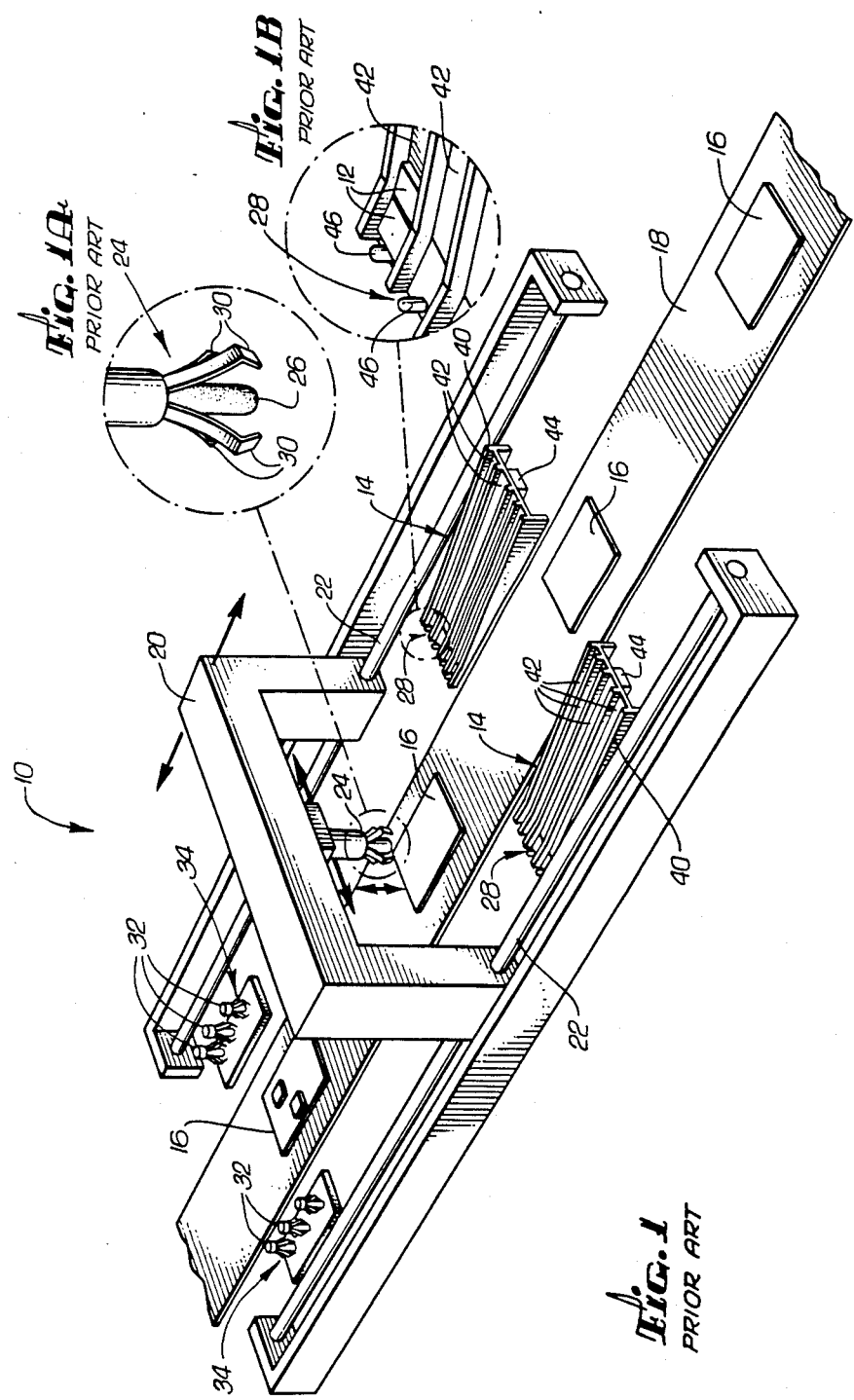

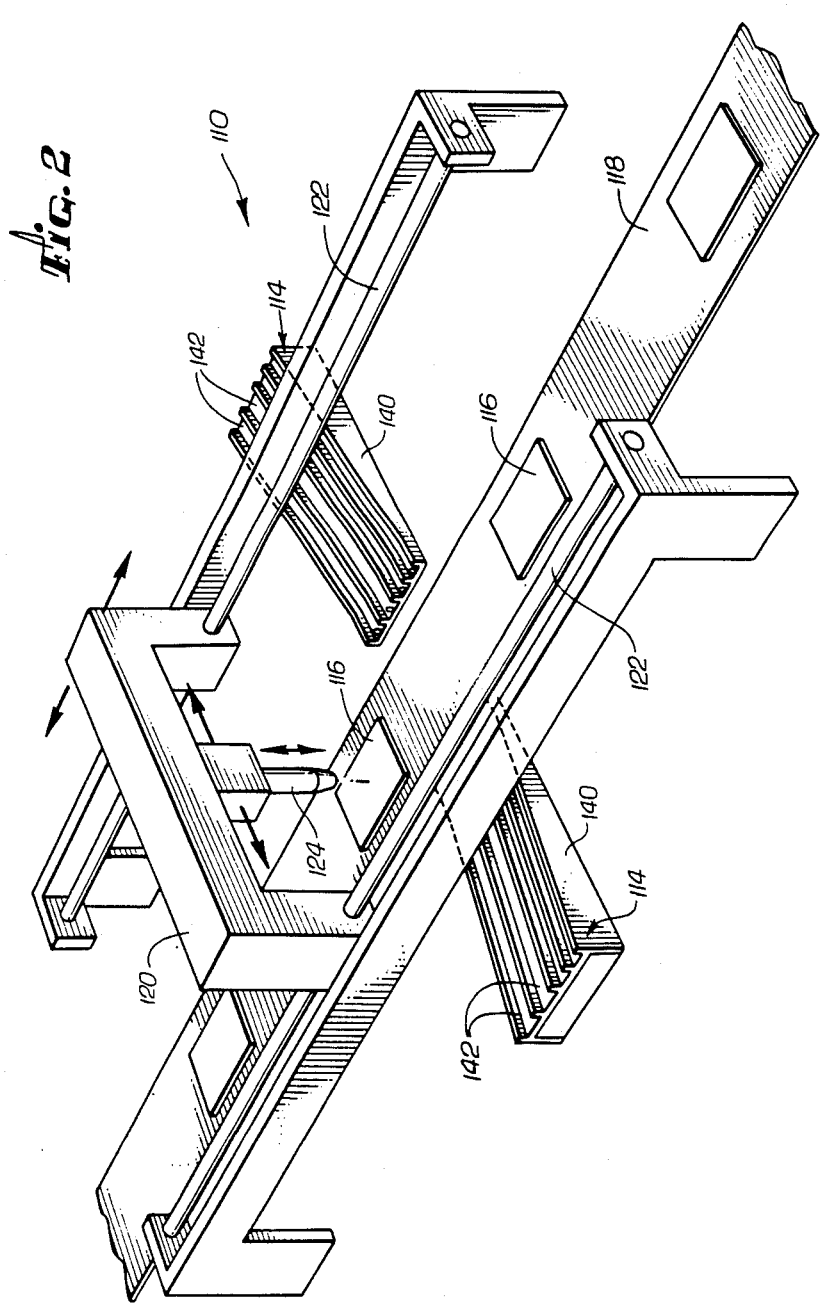

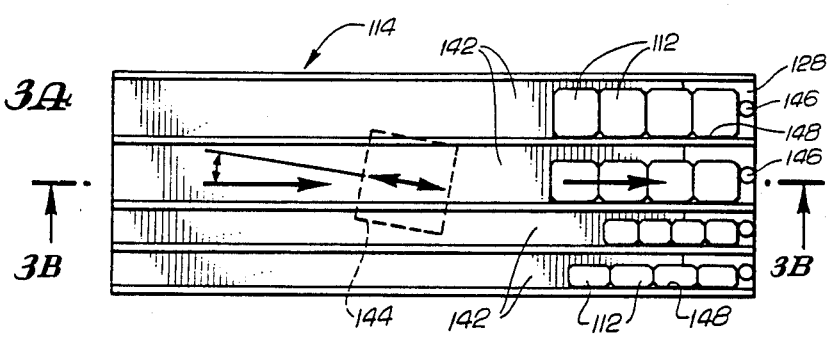
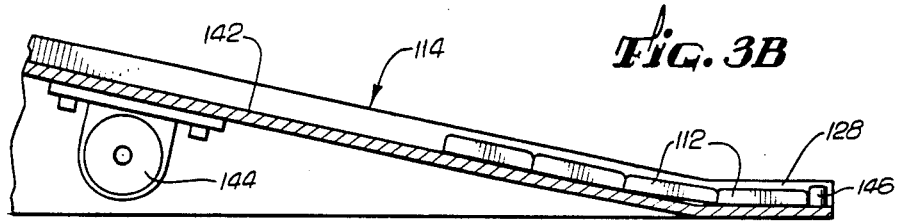
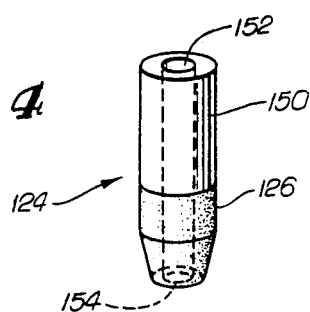
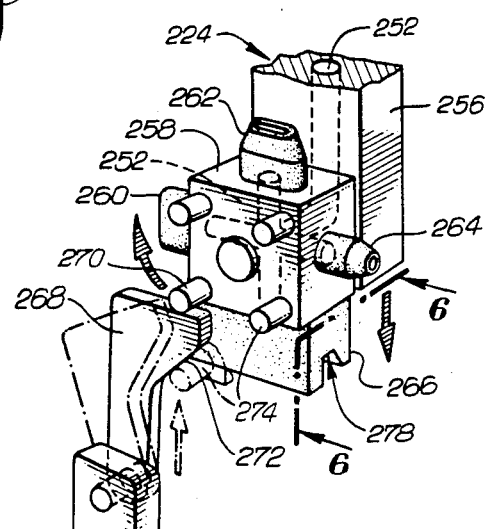
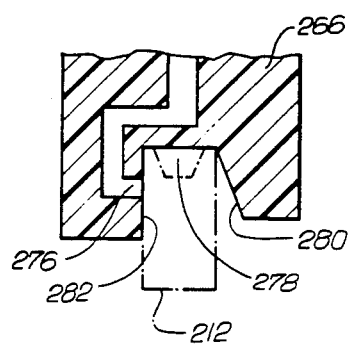

COMPONENT HANDLING MACHINE

BACKGROUND OF THE INVENTION

This invention relates to the field of component handling "pick and place" machines which pick up electronic components such as integrated circuit chips, resistors, capacitors and the like and place these components at predetermined locations on a printed circuit board. The invention more particularly relates to a pick and place machine having a suction head for picking up electronic components and positioning the components on printed circuit boards. The invention also relates to an electronic component feed device which accurately supplies the components to various pick-up locations where the components are picked up by the pick-up head of the pick and place machine.

Pick and place machines are used in electronic device assembly lines for precisely placing electronic components on printed circuit boards at particular predetermined locations. These pick and place machines generally comprise an arm which spans a printed circuit board conveyor belt comprising part of the assembly line. Opposite ends of the arm are movably supported on two tracks which run parallel to but on opposite sides of the conveyor belt so that electric motors can drive the arm back and forth along the conveyor belt. An electronic component pick-up head, which can grasp and release electronic components, is mounted on the arm and driven by electric motors up and down as well as back and forth along the arm. A computer controls the operation of the head to pick up and release components. The computer also controls the motors which drive the head and arm in the three orthogonal directions. Thus, the pick and place machine can be programmed to pick up an electronic component at a predetermined pick-up location, move the component to another predetermined location on a printed circuit board and then release the component at this latter position.

Previously known pick and place machines usually have a pick-up head which includes a flat bottom suction tip and two sets of alignment jaws. The suction tip is used to pick up an electronic component from a component feed device which supplies components to a pick-up location. Because the suction tip usually has only one suction hole located at the flat bottom end of the tip, conventional pick-up heads cannot pick up components which have an uneven upper surface. The uneven surface would prevent the suction tip from making an airtight connection with the component.

The component feed device positions the component to be picked up on the pick-up location to an accuracy of about ±0.1 inch. After the suction tip picks up the component, the alignment jaws on the pick-up head then more precisely align the component. Since the jaws must align the component on the suction tip to within about ±0.0005 inch to enable the pick-up head to properly position the component on the pads of high density printed circuit boards, these jaws must be manufactured to very high tolerances. Thus, each pick-up head is a relatively expensive piece of equipment.

Furthermore, different size jaws are required for different size components. This is because the smaller jaws cannot open wide enough to grasp the larger components and the large jaws are not delicate enough to fit between and to place small components on the board. Therefore, each jaw-type pick-up head must be replaced with one of a different size every time a different size component is to be picked up and placed on the board. Previously known pick and place machines can be programmed to automatically move to a head change location, disconnect one pick-up head and reconnect a different size head, when required. However, this head changing procedure usually takes about ten seconds. While a single head change will not use up a lot of time, if the head must be changed repeatedly the procedure can be very expensive because it can significantly decrease the output of the assembly line.

These previously known jaw-type pick-up heads have the advantageous characteristic that there is no need for the electronic component feed devices to precisely prealign the electronic components at the pick up location. Provided that the electronic components are prealigned to within about ±0.25 inch by the component feed device, the prior art suction tip will be able to pick up the component. The alignment jaws can then precisely center the component relative to the head. However, these devices have serious disadvantages which restrict their applicability in many situations. For example, as previously noted a system which uses these jaw-type pick up heads can be very expensive, particularly if a multiplicity of different sized heads are required. Furthermore, the placement of the jaws at the lateral sides of the components limits how close together the jaws can place the components on the board. Thus, jaw-type pick-up heads may be unable to place small components on very high density printed circuit boards.

The electronic feed devices of conventional pick and place machines comprise a vertically inclined slide member which has one or more parallel electronic component feed channels formed in its surface. The channels are straight and run from the high end of the inclined member to the low end. A number of each type of component is loaded into the upper end of each channel. The components then slide down toward the lower end of the channels. Each channel has a protrusion or stop at its mouth to stop the components from spilling out the bottom of the channels. The location where the lowermost component in each channel stops is the pick-up location for the components in that channel. The lowermost inch or so of each channel is horizontal rather than inclined so that the flat bottomed pick-up tip can make an airtight seal with the flat upper surface of the component at the pick up location. After the pick-up head removes the lowermost component from the feed channel, the next component in that channel slides down to replace it.

To help urge the components down the feed channels toward the pick-up locations, a vibrator is mounted to the vertically inclined member and oriented so that the back and forth motion of the vibrations is parallel to the longitudinal direction of the channels. These vibrations urge the components down the incline in the direction of the vibrations. Nevertheless, even with the vibrations urging the components down the inclined feed channels, each channel must still be somewhat wider than the components which it contains so that the components will not bind in the channel, but will instead be free to slide down the inclined floor of the channel to the pick up location. The width of the channel, however, limits the positional accuracy with which conventional electronic component feed devices can position electronic components at the pick up locations. Usually, each channel must be about 0.2 inch wider than the component which it contains to prevent the component from becoming stuck in the channel. As a component moves down the vibrating feed channel, it tends to migrate randomly from one side of the channel to the other. Thus, the accuracy with which these conventional feed devices can position components at the pick up locations is limited to about ±0.1 inch.

Since the tracks supporting the arm of these previously described pick and place machines are located on opposite sides of the printed circuit board conveyor belt, electronic component feed devices have had to be positioned between the tracks and the slide members containing the components have been disposed at a relatively low inclination to avoid the risk of being damaged by contact with the arm in the event that a programming error accidentally directed the arm over the component feed devices. Also, because the high end of the feed channels, where components are loaded into the component feed devices, is positioned between the tracks that support the arm of the machines, an operator must lean over one of the tracks to replenish the supply of components in the channels of the feed devices. This practice can be dangerous if the machine is running because the arm is moved by powerful motors which could drive the arm into the person reloading the feed channels. Thus, to avoid the danger of being hit by the arm, these previous machines generally should be turned off before the operator replenishes the supply of electronic components in the component feed channels. Stopping the machine, however, is obviously undesirable because it decreases the efficiency of the assembly line.

The device of the present invention has been designed to overcome many of the disadvantages associated with these prior art pick and place machines.

SUMMARY OF THE INVENTION

Unlike the electronic component feed devices of the previously described pick and place machines, which only position the components at the pick up location to an accuracy of about ±0.1 inch, the electronic component feed device of the present invention precisely positions the electronic components at the pick up location with an accuracy of about ±0.0005 inch. A suction cup head, suspended from the arm of the present pick and place machine, then picks up the precisely positioned electronic component at the pick-up location and transfers the component to a predetermined location on a printed circuit board. The pick-up head has a rubber suction tip which securely grasps the component so that the precise positioning and alignment of the component will not be disturbed as the head transfers the component from the pick-up location to the printed circuit board. Since the component feed device of the present invention precisely positions the components at the pick up locations, the pick-up head of the present invention does not need the alignment jaws of the previously known pick and place machines.

Like the previously described electronic component feed devices, the feed device of the present invention includes a vertically inclined member which has one or more electronic component feed channels formed in its surface. The channels run from the high end of the inclined member to its low end. When components are loaded into the upper end of each channel, they tend to slide down the channels toward the pick-up locations at the lower end of each channel. The present electronic component feed device achieves the the precise alignment necessary for the correct placement of the electronic components on the pads of a printed circuit board by mounting a vibrator to the inclined member. The vibrator vibrates the electronic component feed channels to forceably drive the components toward the pick-up locations. The vibrator is coupled to the inclined member so that the back and forth direction of the vibrations is offset by approximately 10° from the lengthwise direction of the channels. In this way, the vibrations drive the components both toward the pick-up locations and simultaneously against one sidewall of each feed channel. Thus, when the electronic components reach the end of the feed channels at the pick-up locations, the vibrations hold the electronic components against a stop at the end of each channel and simultaneously against the sidewall of each channel. By precisely machining the channels and the stops, the vibrations will precisely position the electronic components at the pick-up locations.

Preliminary experiments conducted by the applicant suggest that the 10° offset of the direction of the vibrations may be fairly critical. If the angle is significantly more than about 10°, the components tend to vibrate wildly within the feed channel. Conversely, if the angle is significantly less than 10°, then little or no control is obtained over the position of the components within the channels and the components tend to be driven forward but at the same time move from one side of the channel to the other. Nevertheless, it appears that the most advantageous angle is dependent upon the frequency and amplitude of the vibrations and some minor amount of experimentation may be required to optimize these parameters in any given situation.

The tracks which support the arm of the previously described pick and place machine are positioned at the same height as the printed circuit board conveyor belt which runs through the center of the machine. In contrast, however, the tracks of the pick and place machine of the present invention are raised above the level of the printed circuit board conveyor belt. Since the tracks of the pick and place machine of the present invention are elevated, the component feed devices can be positioned under the tracks and out of the path of the arm. Thus, with this configuration, there is no danger that a programming error will inadvertently drive the arm into contact with the feed devices.

Each feed device is oriented under the tracks so that the high end of the channels, where an operator would insert components to resupply the feed channels with components, is located outside of the two tracks or immediately under one of them. The pick up locations, at the lower opposite end of each channel, are located between the two tracks and closer to the conveyor belt than the high end of the feed device. The advantage of this configuration is that an operator can resupply components to the feed channels without reaching over the tracks.

BRIEF DESCRIPTION OF THE DRAWINGS

FIG. 1 is a perspective plan view of a conventional prior art pick and place machine.

FIG. 1A is a detailed view of the pick-up head of the device of FIG. 1.

FIG. 1B is a detailed view of the component feed device shown in FIG. 1.

FIG. 2 is a perspective plan view of one embodiment of the pick and place machine of the present invention having tracks elevated above the level of the conveyor belt and electronic component feed devices feeding electronic components under the tracks to various pick up locations.

FIG. 3A is a top view of the vibrating electronic component feed device which is also shown in FIG. 2.

FIG. 3B is a cross-sectional view of the feed device of FIG. 3A taken along the line 3B—3B.

FIG. 4 is a perspective, partially transparent and more detailed view of a first embodiment of the pick-up head which is also shown in FIG. 2.

FIG. 5 is a perspective view of a second embodiment of a pick-up head of the present invention. This embodiment has four different types of suction pick-up tips mounted on a rotary member and a pawl for ratcheting the position of the four heads.

FIG. 6 is an enlarged cross-sectional view of the lowermost pick-up tip illustrated in FIG. 5 taken along the line 6—6.

DETAILED DESCRIPTION OF THE PREFERRED EMBODIMENTS

FIGS. 1, 1A and 1B illustrate the basic design of a typical, previously known pick and place machine 10 of the type which is frequently utilized in electronic device assembly lines. The machine is designed to pick up electronic components, such as integrated circuit chips 12, from component feed devices 14 and then place the components 12 at the proper position on printed circuit boards 16. A conveyor belt 18 runs through the center of the machine 10 to provide printed circuit boards 16 to the machine 10 and then transport the boards 16 further down the assembly line after the machine 10 has properly positioned various electronic components 12 on the boards 16.

This previously known pick and place machine 10 comprises an arm 20 which straddles the conveyor belt 18 and which rides on two parallel tracks 22 positioned at opposite sides of the belt 18. Each side of the arm 20 is supported on the tracks 22 so that the arm 20 can move back and forth along the tracks 22 parallel to the conveyor belt 18. A pick-up head 24 is mounted on the arm 20 in a well known manner so that the head 24 can move both vertically up and down and laterally along the arm 20. Electric motors (not shown) drive the head 24 up, down and laterally along the arm 20 and also drive the arm 20 back and forth along the tracks 22. The operation of these motors is controlled by a computer (not shown) which can be programmed to move the pick-up head 24 in all six directions.

The pick-up head 24 itself includes a vacuum operated, flat-bottomed suction tip 26 which is used to pick up the electronic components 12 from certain predetermined pick-up locations 28 at the lower end of the component feed devices 14. To obtain the precision required for accurately placing components 12 on high density printed circuit boards 16, the pick-up head 24 also has several aligning jaws 30 mounted laterally around the suction pick-up tip 26. As previously explained, pick-up heads 32 having different size jaws are required to manipulate different size components. Therefore, when a different size head 32 is required, the arm 20 of the machine 10 moves to the pick-up head storage location 34, disconnects the head 24 which is currently attached to the arm 20 and picks up a different size head 32.

The electronic components 12 are supplied to the pick-up locations 28 by component feed devices 14. Each component feed device 14 comprises a vertically inclined slide member 40 which has a plurality of straight, parallel channels 42 formed in its surface. Each channel 42 is formed to the proper depth and width to hold a particular electronic component 12. Each electronic component feed device 14 also has a vibrator 44 mounted to it to vibrate the walls and floor of the channels 42 formed in the inclined member 40. The vibrator 44 is mounted to the inclined member 40 in such a way that the back and forth motion of the vibrator 44 is parallel to the longitudinal direction of the channels 42. The vibrations, acting in concert with the inclination of the channels 42, drive the components 12 down toward the stop 46 at the pick-up location 28 of each channel 42, but at the same time also permit the components 12 to migrate randomly from side to side within the feed channels 42. Thus, the accuracy to which each channel 42 locates the components 12 at its pick-up location 28 is determined by the amount that the width of the channel exceeds the width of the components in the channel.

FIG. 2 illustrates one embodiment of the pick and place machine 110 of the present invention. This embodiment is similar to the conventional pick and place machine 10 of FIG. 1 to the extent that it comprises an arm 120 which straddles the conveyor belt 118 and which rides on two parallel tracks 122 positioned on opposite sides of the belt 118. The embodiment also has a pick-up head 124 which is mounted on the arm 120 so that the head 124 can move both vertically up and down and laterally along the arm 120. Computer controlled motors (not shown) move the arm 120 back and forth along these tracks 122 and the head 124 vertically and laterally along the arm 120 so that the head 124 is moveable in all six directions.

The present invention differs from conventional pick and place machines, however, in that the tracks 122 are elevated above the level of the printed circuit board conveyor belt 118. Also, the component feed devices 114 are placed under the tracks 122, rather than between them. With this configuration, the high end of each feed channel 142 is outside of the two tracks 122 and the mouths of the feed channels 142, at the lowest end of the inclined member 140, are located inside the two tracks 122. One advantage of the present configuration is that an operator can replenish the electronic component supply (e.g. integrated circuit chips) in the feed channels 142 from outside the tracks 122. Thus, unlike with the machine shown in FIG. 1, the operator need not reach over and between the tracks 122 to refill the feed channels 142 with electronic components 112 but, instead, can remain completely and safely outside of the path of the arm 120.

As best shown in FIGS. 3A and 3B, the electronic component feed device 114 of the present invention is designed to more accurately position the components 112 at the pick-up locations 128 than was possible with previously known feed devices 114. Rather than aligning the vibrator 144 so that its back and forth direction of vibrations is parallel to the longitudinal direction of the feed channels 142, as in conventional electronic component feed devices, the vibrator 144 of the present invention is aligned so that the back and forth motion of its vibrations is angled by approximately 10° from the longitudinal direction of the channels 142. As in conventional feed devices, the vibrations drive the components 112 down toward the pick-up locations 128 but, in addition, because the direction of the vibrations has a lateral component, the vibrations simultaneously drive the components 112 against one sidewall 148 of each channel 142. Since the wall 148 of each channel 142 and the stop 146 at the mouth of the channels 142 are precisely machined and positioned, the positional accuracy of the components 112 at the pick-up locations 128 can be about ±0.0005 inch or less. Thus, this precise prealignment accomplished by the electronic component feed device 114 of the present invention totally eliminates the need for alignment jaws on the pick-up head 124.

Another advantage of the component feed device 114 of the present invention is that, unlike in previously known feed devices, channels 142 of differing widths need not be formed to accommodate different size components. Instead, since the vibrations urge the components 112 simultaneously down each channel 142 and against one side wall 148 of each of the channels 142, a wide channel will accurately position both wide and narrow components with equal accuracy. Thus, the present feed devices 114 are more flexible than conventional feed devices because particular width channels do not have to be formed for each size component 112. Instead, although FIG. 3A illustrates a feed device 114 having different width channels, a plurality of standard width channels 142 can be formed in the feed device and these channels 142 used to feed either wide or narrow components 112, as may from time to time be convenient.

FIG. 2 shows one embodiment of the pick-up head 124 of the present invention. This head 124 is illustrated in greater detail in FIG. 4. The pick-up head 124 includes a hollow member 150 which has a resilient rubber tip 126. The end of the rubber tip 126 is flat and a channel 152 in the hollow member 150 continues through to the flat bottom surface of the tip 126. A vacuum hose (not shown), attached to the top of the hollow member 150 draws air into the hole 154 at the bottom of the tip 126. To pick up a component 112 with this pick-up tip 124, the computer first directs the head 124 over the component 112 at the pick-up location 128 of a feed device 114. The tip 126 is then moved down until it contacts the flat upper surface of a component 112. The suction created at the bottom of the tip 126 holds the component 112 against the flat bottom surface of the pick-up tip 126 while the head 124 moves the component 112 to the correct pads on a printed circuit board 116. To release the component 112 from the head 124, the computer directs a valve (not shown) along the vacuum hose to open. The valve admits air into the hose until the pressure inside the hollow member is increased to ambient pressure. This breaks the vacuum connection between the rubber tip 126 and the component 112, thereby releasing the component 112 onto the printed circuit board 116.

FIG. 5 illustrates a second embodiment of the pick-up head 224 of the present invention. This embodiment comprises a vertical member 256 which is coupled to the arm of the pick and place machine in a well known manner so that it can be moved up and down as well as laterally along the arm. This embodiment also includes a ratcheting rotatable member 258 which is rotatably coupled to the vertical member 256. Hollow passages 252 formed in the rotatable and vertical members, 258 and 256, supply vacuum suction from the vacuum hose (not shown) through the vertical member 256 and then out to the four faces of the rotatable member 258. Each one of these four faces has a different size or type of pick-up tip, 260, 262, 264 and 266, mounted on it for use with different types and sizes of electronic components.

As previously explained, pick and place machines are frequently required to pick up and place various size components exactingly onto the pads of printed circuit boards. However, if small diameter flat bottomed suction pick-up tips (such as the tip denominated by reference number 264) are used to pick up wide components, the components have a tendency to pivot around the suction tip 264, thus losing the precise positioning imparted to them by the component feed device. Conversely, the large diameter pick-up tips (such as the tip denominated by reference number 260) cannot always be used with the narrower electronic components because such wide tips 260 unnecessarily limit the density with which small components can be placed on the board. Furthermore, flat bottom suction pick-up tips cannot pick up components that do not have a flat upper surface. Thus, there is a need to match the size of the particular component to both the size and configuration of the pick-up head. The embodiment of the present invention shown in FIG. 5 meets this need by providing the four sides of the rotatable member 258 with pick-up tips of different size and configuration. The four different pick-up tips can be selectively placed in the lower position by rotation of the member 258 so that the selected tip can pick up electronic components from the feed devices and then place these components on a printed circuit board.

To rotatably position a particular preselected pick-up tip, the computer directs the head 224 over a pawl 268 and then drives the head 224 downwardly so that one of the four bumpers 270 which extend perpendicularly from the front face of the rotatable member 258 contacts the upper surface of the pawl 268. The pawl 268 remains unmoved as the head 224 continues to be driven down. However, since the bumper 270 is offset from the axis of the rotatable member 258, the rotatable member 258 is forced clockwise around the contact point of the bumper 270 and the pawl 268 as the head 224 continues down until another suction pick-up tip is positioned at the bottom of the rotatable member 258. After the pawl 268 has repositioned the suction tips, 260, 262, 264 and 266, the pick and place machine then retracts the head 224 so that another one of the bumpers 274 engages the lower curved surface 272 of the pawl 268. However, as shown by the dotted lines of FIG. 5, the force of the bumper 274 against the lower curved surface 272 pivots the pawl 268 to the left in that figure. Thus, the rotational position of the pick-up tips is maintained as the pick-up head 224 is raised. In this way, variously sized and configured pick-up tips can be positioned downward to engage variously sized and configured electronic components. By repeating the up and down motion of the head 224 over the pawl 268, the computer can ratchet any one of the four tips into the lower position. Ratcheting the rotatable member 258 to reposition the pick-up tips takes less time than changing conventional pick-up heads and thus increases the efficiency of the pick and place machine of the present invention.

The upper pick-up tip 262 as well as the rightmost 264 and leftmost 260 pick-up tips shown in the embodiment of FIG. 5 are generally conically shaped. The tip of each cone is flat so that the flat surface will form a vacuum tight seal on the flat upper surface of an electronic component when the flat surface of the tip is pressed against the flat upper surface of the electrical component. However, the lowermost pick-up tip 266, shown in greater detail in FIG. 6, has its suction hole 276 at the side of a channel 278 formed in its distal surface. This tip 266 is designed to pick up components which do not have a flat upper surface. To pick up a component with this tip 266, the tip 266 is positioned with the channel 278 facing down, as shown in FIG. 5. The tip 266 is then moved down over a component 212 so that the component 212 is inserted into the channel 278. As the head 224 moves down over the component 212, the sloped wall 280 of the channel 278 forces the component 212 against the opposite channel wall 282 until the suction created at the vacuum suction hole 276 grasps the side of the component 212. The computer then directs the head over a particular predetermined location on the board. When the head reaches this predetermined location, the vacuum suction connection is broken by bringing the pressure in the vacuum hose up to ambient pressure, thus releasing the component 212.

Two preferred embodiments of the present invention have been described. Nevertheless, it is understood that one may make various modifications without departing from the spirit and scope of the invention. Thus, the claimed invention is not limited to the preferred embodiments described herein.

I claim:

1. A pick and place machine having a pick-up head for picking up electronic components from a pick-up location and placing the components at predetermined positions on printed circuit boards, the machine comprising:
   a conveyor belt for transporting printed circuit boards along the machine;
   at least one track parallel to said conveyor belt, said track being elevated above said conveyor belt;
   a member supported by the track and extending over the conveyor belt, said member being movable along the track;
   pick-up means coupled to and movable along the member for picking up and placing said electronic components on the printed circuit boards;
   an electronic component feed device including a vertically inclined slide member disposed below said track, the inclined member having at least one channel forming groove, said channel extending from the high to the low end of the inclined member and being adapted to receive electronic components at the high end of the channel and slidably direct the components to a pick-up location at the lower end of the channel, the lower end of said channel at said pick-up location being horizontally disposed; and
   vibrating means for vibrating the inclined member, the vibrating means vibrating in a back and fourth linear manner along a single line, said single line being disposed at an acute angle relative to the longitudinal direction of the lower end of said channel at said pick-up location such that the vibrations urge the electronic components down the channel toward the pick-up location and to one side of the channel.

2. The pick and place machine of claim 1, wherein said pick-up means comprises a hollow member having a resilient tip, said tip having a hole formed therein communicating with the hollow interior of the hollow member; and
   means for supplying suction to the hollow interior of the hollow member so that, when the surface of the tip having the hole is pressed against the surface of one of said electronic components, suction will hold the electronic component to the tip.

3. The pick and place machine of claim 1 wherein said acute angle is approximately 10 degrees from said longitudinal direction.

4. The pick and place machine of claim 1 further comprising a stop for said components at the lower end of the channel, said one side of said channel at said pick-up location and said stop being precisely positioned to precisely locate successive components at said pick-up location for pick-up by said pick-up means so that said electronic components are picked up and placed at said predetermined positions on printed circuit boards by said pick-up means without further alignment by said pick-up means.

5. The pick and place machine of claim 1 wherein the high end of said channel is located outside of the area over which said member supported by said track is movable.

6. The pick and place machine of claim 1 wherein said pick-up means comprises;
   a reciprocatingly movable member;
   a rotatable member rotatably coupled to said movable member;
   a plurality of pick-up tips for selectively attaching to and releasing the electronic components, each of said pick-up tips being located on said rotatable member at a unique angular position with respect to the axis of rotation of said rotatable member; and
   rotating means for selectively rotating the rotatable member around the axis to any one of a plurality of angular positions with respect to the movable member.

7. The pick and place machine of claim 6, wherein the rotating means of said pick-up means comprises:
   a plurality of bumpers projecting from the surface of the rotatably member, wherein each bumper is located on said rotatable member at a unique angular position with respect to the axis of rotation of the rotatably member, and
   a pawl, pivotably mounted to a fixed location, for engaging said bumpers so that reciprocating motion of the movable member which brings said bumpers into contact with the pawl will ratchetably rotate the rotatable member.

8. The pick and place machine of claims 6 and 7 wherein the pick-up means comprises:
   a projecting member projecting from the circumferential surface of the rotating member, said projecting member having a flat resilient distal surface and a hole formed in the projecting member through the flat surface; and
   means for producing less than ambient atmospheric pressure in said hole so that when said flat surface is touched to a flat surface of one of the electronic components, the projecting member will suctionably attach to the component.

9. The pick and place machine of claims 6 and 7 wherein the pick-up means comprises:
   a projecting member projecting from the circumferential surface of the rotating member, wherein an identation is formed in the distal surface of the projecting member and a hole is formed in the wall of the indentation; and
   means for producing less than ambient atmospheric pressure in said hole so that when one of the electronic components is inserted into the indentation, the wall of the indentation will suctionably attach to the component.

* * * * *